(12) United States Patent
Chen

(10) Patent No.: US 8,314,496 B2
(45) Date of Patent: Nov. 20, 2012

(54) SEMICONDUCTOR DEVICE AND INDUCTOR

(75) Inventor: Te-Wei Chen, Hsinchu County (TW)

(73) Assignee: Silicon Motion, Inc., Jhubei, Hsinchu County (TW)

( * ) Notice: Subject to any disclaimer, the term of this patent is extended or adjusted under 35 U.S.C. 154(b) by 337 days.

(21) Appl. No.: 12/550,646

(22) Filed: Aug. 31, 2009

(65) Prior Publication Data

US 2010/0308470 A1 Dec. 9, 2010

(30) Foreign Application Priority Data

Jun. 6, 2009 (TW) ................................ 98118894 A

(51) Int. Cl.
*H01L 23/48* (2006.01)
*H01F 27/28* (2006.01)
(52) U.S. Cl. ......... 257/774; 257/E23.145; 257/E21.022; 336/225
(58) Field of Classification Search ................... 257/774, 257/E21.022, E23.145; 438/629; 336/200, 336/208
See application file for complete search history.

(56) References Cited

U.S. PATENT DOCUMENTS

| | | | |
|---|---|---|---|
| 6,078,088 A * | 6/2000 | Buynoski ........................ | 257/410 |
| 7,064,411 B2 * | 6/2006 | Hashizume et al. ........... | 257/531 |
| 2005/0190035 A1 * | 9/2005 | Wang ............................. | 336/200 |

FOREIGN PATENT DOCUMENTS

| | | |
|---|---|---|
| CN | 101090025 | 12/2007 |
| CN | 101179072 | 5/2008 |

OTHER PUBLICATIONS

Chinese language office action dated Aug. 9, 2011.
English language translation of abstract of CN 101090025 (published Dec. 19, 2007).
Chinese language office action dated May 16, 2012.
English language translation of abstract of CN 101179072 (published May 14, 2008).

* cited by examiner

*Primary Examiner* — Jasmine Clark
(74) *Attorney, Agent, or Firm* — McClure, Qualey & Rodack LLP

(57) ABSTRACT

A semiconductor device and an inductor are provided. The semiconductor device includes a top level interconnect metal layer ($M_{top}$) pattern. A below-to-top level interconnect metal layer ($M_{top-1}$) pattern is disposed directly below the top level interconnect metal layer pattern. A first via plug pattern is vertically disposed between the top level interconnect metal layer pattern and the below-to-top level interconnect metal layer pattern, electrically connected to the top level interconnect metal layer pattern and the below-to-top level interconnect metal layer pattern. The top level interconnect metal layer pattern, the below-to-top level interconnect metal layer pattern and the first via plug pattern have profiles parallel with each other from a top view.

20 Claims, 3 Drawing Sheets

SEMICONDUCTOR DEVICE AND INDUCTOR

CROSS REFERENCE TO RELATED APPLICATIONS

This Application claims priority of Taiwan Patent Application No. 098118894, filed on Jun. 6, 2009, the entirety of which is incorporated by reference herein.

BACKGROUND OF THE INVENTION

1. Field of the Invention

The present invention relates to a semiconductor device, and more particularly, relates to an inductor.

2. Description of the Related Art

Inductors are commonly used in radio frequency (RF) circuits, formed by a special RF process. In the RF process, a very thick metal layer is used to form inductors to achieve low resistance and a good Q factor. The very thick metal layer, however, results in relatively higher fabrication costs.

Thus, inductors can be formed by a less costly standard logic process. The inductors formed by the standard logic process, however, are relatively thinner, thereby resulting in high resistance and poor Q factors.

Therefore, a novel inductor is desired to solve the aforementioned problems.

BRIEF SUMMARY OF INVENTION

A semiconductor device and an inductor are provided. An exemplary embodiment of the semiconductor device comprises a top level interconnect metal layer pattern, a below-to-top level interconnect metal layer pattern directly below the top level interconnect metal layer pattern, and a first via plug pattern vertically disposed between the top level interconnect metal layer pattern and the below-to-top level interconnect metal layer pattern, electrically connected to the top level interconnect metal layer pattern and the below-to-top level interconnect metal layer pattern, wherein the top level interconnect metal layer pattern, the below-to-top level interconnect metal layer pattern and the first via plug pattern have profiles parallel with each other from a top view.

An exemplary embodiment of an inductor comprises a first interconnect metal layer pattern over a substrate, and a second interconnect metal layer pattern over the substrate, directly below a level to the first interconnect metal layer pattern, wherein the second interconnect metal layer pattern is electrically connected to the first interconnect metal layer pattern through a first via plug pattern, and the first interconnect metal layer pattern, the second interconnect metal layer pattern and the first via plug pattern have profiles parallel with each other from a top view.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIG. 1b is a cross section taken along line A-A' of FIG. 1a.

FIG. 2b is a cross section taken along line B-B' of FIG. 2a.

FIG. 3b is a cross section taken along line C-C' of FIG. 3a.

DETAILED DESCRIPTION OF INVENTION

Figure 1A:
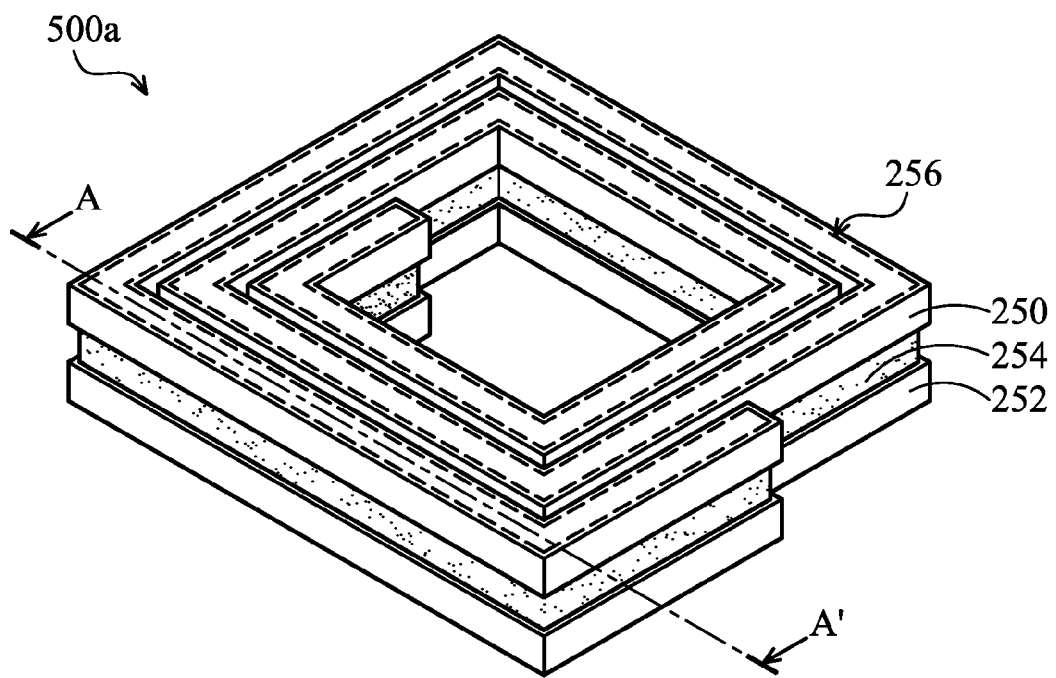
FIG. 1a shows a top view of one exemplary embodiment of a semiconductor device of the invention.

The following description is of a mode of carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto but is only limited by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Figure 1B:
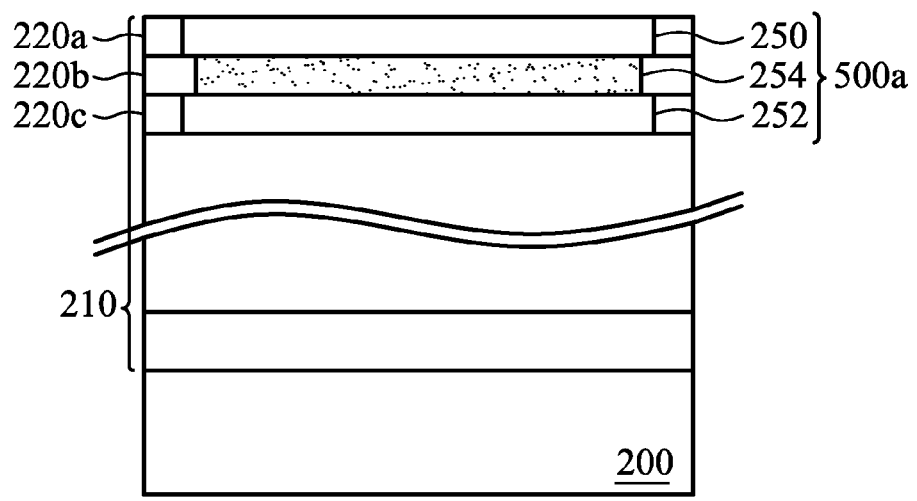

In accordance with an embodiment of the present invention, embodiments of a semiconductor device are provided. FIG. 1a shows a top view of one exemplary embodiment of a semiconductor device 500a of the invention. FIG. 1b is a cross section taken along line A-A' of FIG. 1a. FIG. 1a only shows the semiconductor device 500a for simplicity. FIG. 1b further shows a substrate 200 and an interconnect structure 210 to describe the relative positions among the semiconductor device 500a, the substrate 200 and the interconnect structure 210. In one embodiment, the semiconductor device 500a is formed by a standard logic process. The semiconductor device 500a may serve as an inductor 500a disposed over the substrate 200, in the interconnect structure 210. In one embodiment, the substrate 200 may comprise silicon. In alternative embodiments, SiGe, bulk semiconductor, strained semiconductor, compound semiconductor, silicon on insulator (SOI), and other commonly used semiconductor substrates can be used for the substrate 200. The substrate 200 may have a desired conductive type by implanting P-type or N-type dopants. In one embodiment, the substrate 200 may comprise doped regions disposed therein to form microelectronic units including transistors, diodes, resistors, image sensors, memory cells or combinations thereof. As shown in FIG. 1b, the interconnect structure 210 is disposed over the substrate 200. In one embodiment, the interconnect structure 210 may be formed by a plurality of interconnect metal layer patterns at different levels (e.g. a top level interconnect metal layer ($M_{top}$) pattern 250 and a below-to-top level interconnect metal layer ($M_{top-1}$) pattern 252), a plurality of interlayer dielectric (ILD) layers sandwiched between any two interconnect metal layer patterns at different levels (e.g. interlayer dielectric layers 220a to 220c) and a plurality of via plug patterns vertically disposed in the interlayer dielectric layers (e.g. a via plug pattern 254). The interconnect structure 210 may be used as an electrical interconnection among devices or between devices. In one embodiment, the number of interconnect metal layer patterns, the interlayer dielectric layers and the via plug patterns are not limited but according to design. In one embodiment, the interconnect metal layer patterns of the interconnect structure 210 may comprise Al, Cu or alloys thereof. The interlayer dielectric layers may comprise polymer based dielectrics, for example, phosphorus silicate glass (PSG), fluorinated silicate glass (FSG), undoped silicate glass (USG) or the like. The via plug patterns may comprise Al, Cu, W, Ti, Ta or alloys thereof.

As shown in FIG. 1b, one exemplary embodiment of a semiconductor device 500a, for example, an inductor 500a, is disposed over the substrate 200, in the interlayer dielectric layers 220a to 220c of the interconnect structure 210. The semiconductor device 500a may comprise a top level interconnect metal layer ($M_{top}$) pattern 250 disposed in the interlayer dielectric layer 220a (the uppermost interconnect metal layer pattern of the interconnect structure 210), a below-to-top level interconnect metal layer ($M_{top-1}$) pattern 252 disposed in the interlayer dielectric layer 220c and a first via plug pattern 254 vertically through the interlayer dielectric layer 220b. The $M_{top-1}$ pattern 252 is disposed directly below the $M_{top}$ pattern 250, isolated from the $M_{top}$ pattern 250 by the interlayer dielectric layer 220b. The first via plug pattern 254 is vertically disposed between the $M_{top}$ pattern 250 and the $M_{top-1}$ pattern 252, electrically connected to the overlying $M_{top}$ pattern 250 and the underlying $M_{top-1}$ pattern 252, wherein the $M_{top}$ pattern 250, the $M_{top-1}$ pattern 252 and the first via plug pattern 254 have profiles parallel with each other from a top view. Also, the $M_{top}$ pattern 250 and the $M_{top-1}$ pattern 252 substantially overlap each other from a top view. For example, the $M_{top}$ pattern 250, the $M_{top-1}$ pattern 252 and the first via plug pattern 254 (please refer a profile 256 of the first via plug pattern 254) may have a coil shape, for example, rectangular coil shape, spiral coil shape or other coil shapes, from a top view. The number of revolutions of the $M_{top}$ pattern 250, the $M_{top-1}$ pattern 252 and the first via plug pattern 254 of the semiconductor device 500a, for example, an inductor 500a, are not limited but according to design.

As shown in FIGS. 1a and 1b, the total thickness of the semiconductor device 500a, for example, an inductor 500a, formed by a standard logic process is the sum of the thickness of three coil-shaped conductive layers of the $M_{top}$ pattern 250, the $M_{top-1}$ pattern 252 and the first via plug pattern 254. Therefore, in the same layout area, the inductor 500a has low resistance. Additionally, the semiconductor device 500a, for example, an inductor 500a, is formed by parallel connecting the interconnect metal layer patterns and the via plug pattern, which are used to form the interconnect structure 210, without additional metal layers or via plugs. Therefore, the resistance of the inductor 500a is reduced and the Q factor of the inductor 500a is improved without using a costly radio-frequency (RF) process or additional metal layers or via plugs.

Figure 2A:
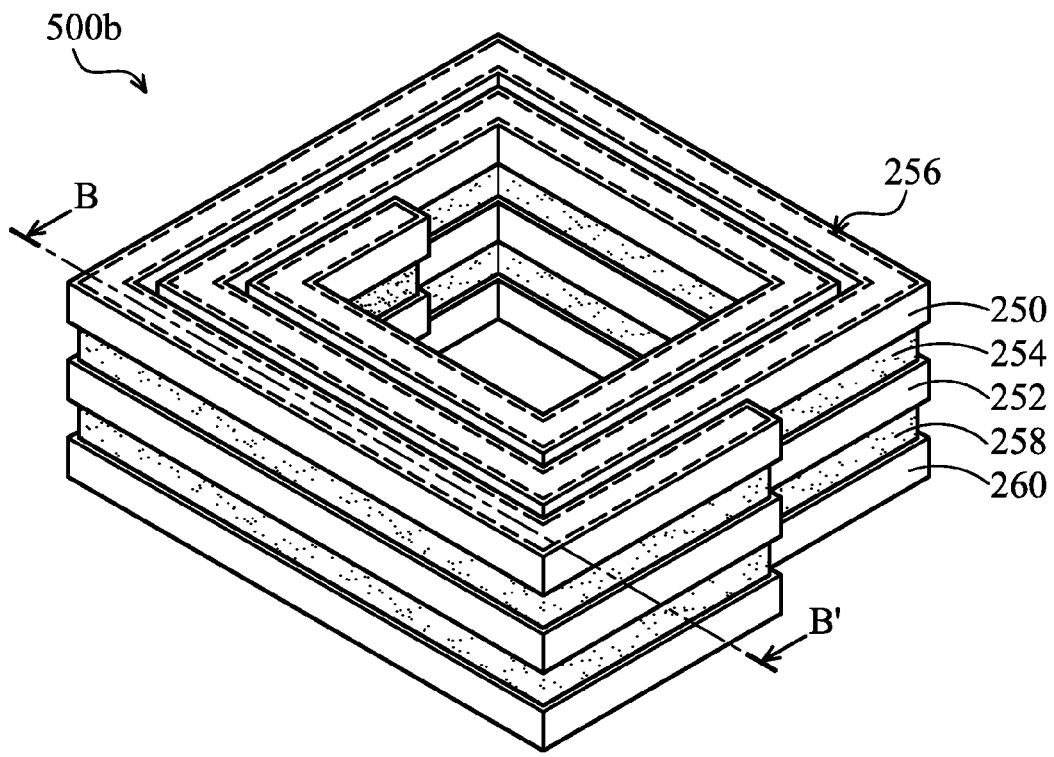
FIG. 2a shows a top view of another exemplary embodiment of a semiconductor device of the invention.
Figure 2B:
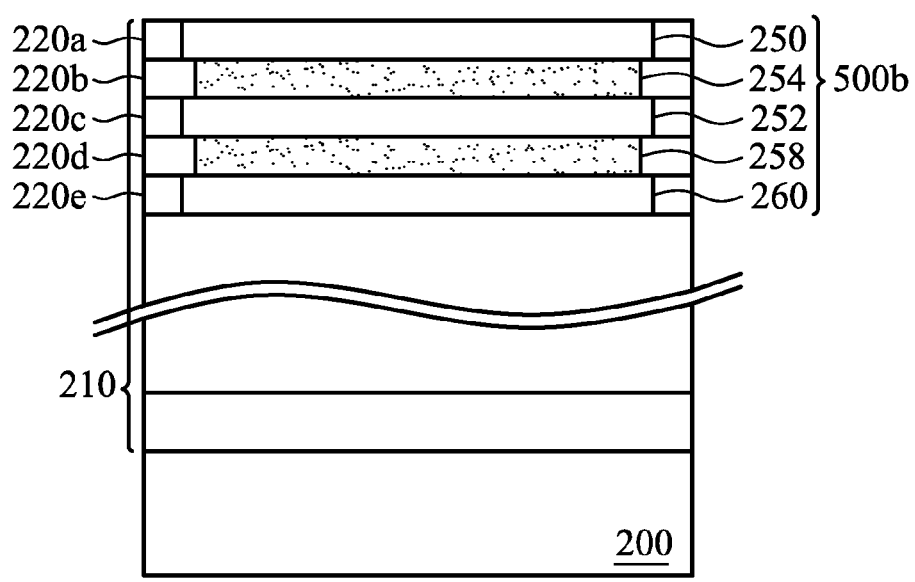

The resistance and the Q factor of an inductor may be defined according to design. FIG. 2a shows a top view of another exemplary embodiment of a semiconductor device 500b of the invention. FIG. 2b is a cross section taken along line B-B' of FIG. 2a. FIG. 2a only shows the semiconductor device 500b for description brevity. FIG. 2b further shows a substrate 200 and an interconnect structure 210 to describe the relative positions among the semiconductor device 500b, the substrate 200 and the interconnect structure 210. In one embodiment, the semiconductor device 500b is formed by a standard logic process. The semiconductor device 500b may serve as an inductor 500b disposed over the substrate 200, in the interlayer dielectric layers 220a to 220e of the interconnect structure 210. The semiconductor device 500b may comprise a top level interconnect metal layer ($M_{top}$) pattern 250 disposed in the interlayer dielectric layer 220a, a below-to-top level interconnect metal layer ($M_{top-1}$) pattern 252 disposed in the interlayer dielectric layer 220c, a below two levels-to-top level interconnect metal layer ($M_{top-2}$) pattern 260 disposed in the interlayer dielectric layer 220e, a first via plug pattern 254 disposed vertically through the interlayer dielectric layer 220b and a second via plug pattern 258 disposed vertically through the interlayer dielectric layer 220d. The $M_{top-1}$ pattern 252 is disposed directly below the $M_{top}$ pattern 250, isolated from the $M_{top}$ pattern 250 by the interlayer dielectric layer 220b. The first via plug pattern 254 is vertically disposed between the $M_{top}$ pattern 250 and the $M_{top-1}$ pattern 252, electrically connected to the overlying $M_{top}$ pattern 250 and the underlying $M_{top-1}$ pattern 252. Additionally, the $M_{top-2}$ pattern 260 is disposed directly below the $M_{top-1}$ pattern 252, isolated from the $M_{top-1}$ pattern 252 by the interlayer dielectric layer 220d. The second via plug pattern 258 is vertically disposed between the $M_{top-1}$ pattern 252 and the $M_{top-2}$ pattern 260, electrically connected to the overlying $M_{top-1}$ pattern 252 and the underlying $M_{top-2}$ pattern 260. As shown in FIG. 2a, the $M_{top}$ pattern 250, the $M_{top-1}$ pattern 252, the $M_{top-2}$ pattern 260, the first via plug pattern 254 and the second via plug pattern 258 have profiles parallel with each other from a top view. Also, the $M_{top}$ pattern 250, the $M_{top-1}$ pattern 252 and the $M_{top-2}$ pattern 260 all substantially overlap each other from a top view. For example, the $M_{top}$ pattern 250, the $M_{top-1}$ pattern 252, the $M_{top-2}$ pattern 260, the first via plug pattern 254 (a profile 256 of the first via plug pattern 254) and the second via plug pattern 258 may have a coil shape, for example, a rectangular coil shape, spiral coil shape or other coil shapes, from a top view. The number of revolutions of the inductor 500b is not limited but according to design.

As shown in FIGS. 2a and 2b, the total thickness of the semiconductor device 500b, for example, an inductor 500b, formed by a standard logic process is the sum of the thickness of the five coil-shaped conductive layers of the $M_{top}$ pattern 250, the $M_{top-1}$ pattern 252, the $M_{top-2}$ pattern 260, the first via plug pattern 254 and the second via plug pattern 258. Therefore, in the same layout area, the inductor 500b has much lower resistance. Additionally, the semiconductor device 500b, for example, an inductor 500b, is formed by parallel connecting the interconnect metal layer patterns and the via plug patterns, which are used to form the interconnect structure 210, without additional metal layers or via plugs. Therefore, the resistance of the inductor 500b can be reduced and the Q factor of the inductor 500b can be improved without using a costly radio-frequency (RF) process or additional metal layers or via plugs.

The total thickness of one exemplary embodiment of a semiconductor device, for example, an inductor, of the invention may defined by the number of parallel connected interconnect metal layer patterns and the via plug patterns. The number of interconnect metal layer patterns and the via plug patterns are not limited but according to design (for example, the layer number of the interconnect structure).

Figure 3A:
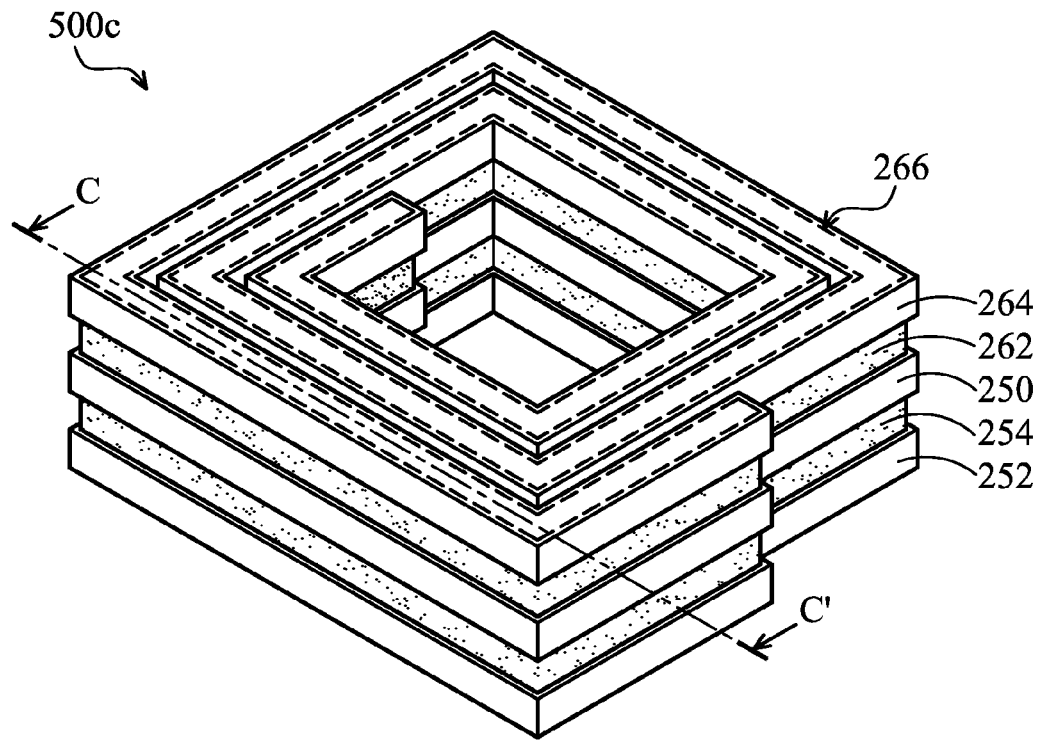
FIG. 3a shows a top view of yet another exemplary embodiment of a semiconductor device of the invention.
Figure 3B:
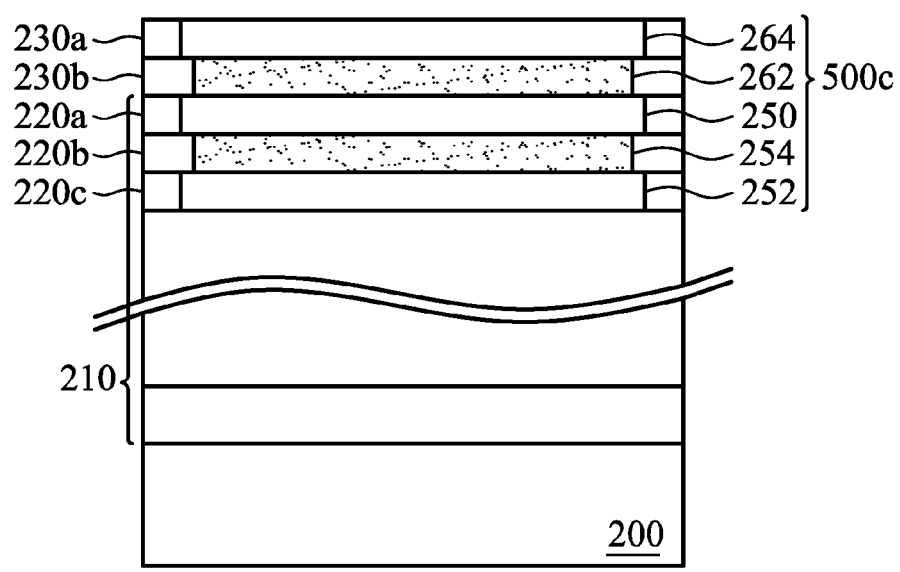

Alternatively, a pad metal layer for a bond pad structure over the interconnect structure 210 may also be used to increase the thickness of the inductor. FIG. 3a shows a top view of yet another exemplary embodiment of a semiconductor device 500c of the invention. FIG. 3b is a cross section taken along line C-C' of FIG. 3a. FIG. 3a only shows the semiconductor device 500c for description brevity. FIG. 3b further shows a substrate 200, an interconnect structure 210, and dielectric layers 230a and 230b to describe the relative positions among the semiconductor device 500c. As shown in FIGS. 3a and 3b, the semiconductor device 500c serving as an inductor 500c may be formed by laminating an $M_{top}$ pattern 250 disposed in the interlayer dielectric layer 220a, an $M_{top-1}$ pattern 252 disposed in the interlayer dielectric layer 220c, an over-to-top level interconnect metal layer ($M_{top-1}$) pattern 264 disposed in a dielectric layer 230a, a first via plug pattern 254 vertically through the interlayer dielectric layer 220b and a third via plug pattern 262 vertically through a dielectric layer 230b, wherein the $M_{top-1}$ pattern 264 and the pad metal layer are at the same level. The $M_{top-1}$ pattern 252 is disposed directly below the $M_{top}$ pattern 250, isolated from the $M_{top}$ pattern 250 by the interlayer dielectric layer 220b. The first via plug pattern 254 is vertically disposed between the $M_{top}$ pattern 250 and the $M_{top-1}$ pattern 252, electrically connected to the overlying $M_{top}$ pattern 250 and the underlying $M_{top-1}$ pattern 252. Additionally, the $M_{top+1}$ pattern 264 is directly over the $M_{top}$ pattern 250, isolated from the $M_{top}$ pattern 250 by the dielectric layer 230b. The third via plug pattern 262 is vertically disposed between the $M_{top+1}$ pattern 264 and the $M_{top}$ pattern 250, electrically connected to the overlying $M_{top+1}$ pattern 264 and the underlying $M_{top}$ pattern 250. As shown in FIG. 3a, all of the $M_{top+1}$ pattern 264, the $M_{top}$ pattern 250, the $M_{top-1}$ pattern 252, the first via plug pattern 254 and the third via plug pattern 262 have profiles parallel with each other from a top view. Also, the $M_{top-1}$ pattern 264, the $M_{top}$ pattern 250 and the $M_{top-1}$ pattern 252 substantially overlap each other from a top view. For example, the $M_{top+1}$ pattern 264, the $M_{top}$ pattern 250, the $M_{top-1}$ pattern 252, the first via plug pattern 254 and the third via plug pattern 262 (a profile 266 of the third via plug pattern 262) may have a coil shape, for example, a rectangular coil shape, a spiral coil shape or other coil shapes, from a top view. The number of revolutions of the inductor 500c are not limited but according to design. As shown in FIGS. 3a and 3b, the total thickness of the semiconductor device 500c, for example, the inductor 500c, formed by a standard logic process is the sum of the thickness of the five coil-shaped conductive layers of the $M_{top+1}$ pattern 264, the $M_{top}$ pattern 250, the $M_{top-1}$ pattern 252, the first via plug pattern 254 and the third via plug pattern 262. Additionally, the total thickness of the inductor 500c may be increased by parallel connecting the interconnect metal layer patterns in other level(s) directly below the $M_{top-1}$ pattern 252 through other via plug patterns, thereby reducing the resistance and improving Q factor of the inductor 500c. The number of interconnect metal layer patterns and the via plug patterns are not limited but according to design.

One exemplary embodiment of a semiconductor device of the invention provides an inductor disposed in the interconnect structure, formed by laminating, comprising at least an $M_{top}$ pattern 250, an $M_{top-1}$ pattern 252 and a first via plug pattern 254. The $M_{top}$ pattern 250, the $M_{top-1}$ pattern 252 and the first via plug pattern 254 have profiles parallel with each other from a top view. Also, the $M_{top}$ pattern 250 and the $M_{top-1}$ pattern 252 substantially overlap each other from a top view. In the same layout area, one exemplary embodiment of a semiconductor device, for example, an inductor, of the invention is very thick, thereby reducing resistance thereof. Additionally, one exemplary embodiment of a semiconductor device, for example, an inductor, of the invention is formed by the interconnect metal layer patterns and the via plug patterns of the existing interconnect structure formed by a standard logic process without additional metal layers or via plugs. Therefore, one exemplary embodiment of a semiconductor device for example, an inductor, of the invention may have a reduced resistance and an improved Q factor without using a costly radio-frequency (RF) process or additional metal layers or via plugs.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
a top level interconnect metal layer (Mtop) pattern;
a below-to-top level interconnect metal layer (Mtop−1) pattern directly below the top level interconnect metal layer pattern; and
a single first via plug pattern vertically disposed between the top level interconnect metal layer pattern and the below-to-top level interconnect metal layer pattern, electrically connected to the top level interconnect metal layer pattern and the below-to-top level interconnect metal layer pattern, wherein the top level interconnect metal layer pattern, the below-to-top level interconnect metal layer pattern and the single first via plug pattern have profiles parallel with each other from a top view, and wherein a first horizontal distance between an outer terminal of the single first via plug pattern and an outer terminal of the top level interconnect metal layer pattern or the below-to-top level interconnect metal layer pattern is the same to a second horizontal distance between an inner terminal of the single first via plug pattern and an inner terminal of the top level interconnect metal layer pattern or the below-to-top level interconnect metal layer pattern.

2. The semiconductor device as claimed in claim 1, further comprising:
a below two levels-to-top level interconnect metal layer ($M_{top-2}$) pattern directly below the below-to-top level interconnect metal layer pattern; and
a second via plug pattern vertically disposed between the below-to-top level interconnect metal layer pattern and the below two levels-to-top level interconnect metal layer pattern, electrically connected to the below-to-top level interconnect metal layer pattern and the below two levels-to-top level interconnect metal layer pattern, wherein the below-to-top level interconnect metal layer pattern, the below two levels-to-top level interconnect metal layer pattern and the second via plug pattern have profiles parallel with each other from a top view.

3. The semiconductor device as claimed in claim 1, further comprising:
an over-to-top level interconnect metal layer ($M_{top+1}$) pattern directly over the top level interconnect metal layer pattern; and
a third via plug pattern vertically disposed between the over-to-top level interconnect metal layer pattern and the top level interconnect metal layer pattern, electrically connected to the over-to-top level interconnect metal layer pattern and the top level interconnect metal layer pattern, wherein the over-to-top level interconnect metal layer pattern, the top level interconnect metal layer pattern and the third via plug pattern have profiles parallel with each other from a top view.

4. The semiconductor device as claimed in claim 1, wherein the top level interconnect metal layer pattern, the below-to-top level interconnect metal layer pattern and the first via plug pattern have a coil shape from a top view.

5. The semiconductor device as claimed in claim 2, wherein the below-to-top level interconnect metal layer pattern, the below two levels-to-top level interconnect metal layer pattern and the second via plug pattern have a coil shape from a top view.

6. The semiconductor device as claimed in claim 3, wherein the over-to-top level interconnect metal layer pattern, the top level interconnect metal layer pattern and the third via plug pattern have a coil shape from a top view.

7. The semiconductor device as claimed in claim 1, wherein the top level interconnect metal layer pattern and the below-to-top level interconnect metal layer pattern substantially overlap each other from a top view.

8. The semiconductor device as claimed in claim 2, wherein the below-to-top level interconnect metal layer pattern and the below two levels-to-top level interconnect metal layer pattern substantially overlap each other from a top view.

9. The semiconductor device as claimed in claim 3, wherein the over-to-top level interconnect metal layer pattern and the top level interconnect metal layer pattern substantially overlap each other from a top view.

10. The semiconductor device as claimed in claim 3, wherein the over-to-top level interconnect metal layer pattern and a pad metal layer of the semiconductor device are at the same level.

11. The semiconductor device as claimed in claim 1, wherein the semiconductor device is formed by a standard logic process.

12. An inductor, comprising:
   a first interconnect metal layer pattern over a substrate; and
   a second interconnect metal layer pattern over the substrate, directly below a level to the first interconnect metal layer pattern, wherein the second interconnect metal layer pattern is electrically connected to the first interconnect metal layer pattern through a single first via plug pattern, and the first interconnect metal layer pattern, the second interconnect metal layer pattern and the single first via plug pattern have profiles parallel with each other from a top view, and wherein a first horizontal distance between an outer terminal of the single first via plug pattern and an outer terminal of the first interconnect metal layer pattern or the second level interconnect metal layer pattern is the same to a second horizontal distance between an inner terminal of the single first via plug pattern and an inner terminal of the first interconnect metal layer pattern or the second interconnect metal layer pattern.

13. The inductor as claimed in claim 12, further comprising:
   a third interconnect metal layer pattern over the substrate, directly below a level to the second interconnect metal layer pattern, wherein the third interconnect metal layer pattern is electrically connected to the second interconnect metal layer pattern through a second via plug pattern, wherein the second interconnect metal layer pattern, the third interconnect metal layer pattern and the second via plug pattern have profiles parallel with each other from a top view.

14. The inductor as claimed in claim 12, further comprising:
   a metal layer pattern over the substrate, directly over a level to the first interconnect metal layer pattern, wherein the metal layer pattern is electrically connected to the first interconnect metal layer pattern through a third via plug pattern, and the metal layer pattern, the first interconnect metal layer pattern and the third via plug pattern have profiles parallel with each other from a top view.

15. The inductor as claimed in claim 12, wherein the first interconnect metal layer pattern, the second interconnect metal layer pattern and the first via plug pattern have a coil shape from a top view.

16. The inductor as claimed in claim 13, wherein the second interconnect metal layer pattern, the third interconnect metal layer pattern and the second via plug pattern have a coil shape from a top view.

17. The inductor as claimed in claim 14, wherein the metal layer pattern, the first interconnect metal layer pattern and the third via plug pattern have a coil shape from a top view.

18. The inductor as claimed in claim 12, wherein the first interconnect metal layer pattern and the second interconnect metal layer pattern substantially overlap each other from a top view.

19. The inductor as claimed in claim 13, wherein the second interconnect metal layer pattern and the third interconnect metal layer pattern substantially overlap each other from a top view.

20. The inductor as claimed in claim 14, wherein the metal layer pattern and a pad metal layer of the inductor are at the same level.

* * * * *